USO05727012A

United States Patent [19]
Baillargeon et al.

[11] Patent Number: 5,727,012
[45] Date of Patent: Mar. 10, 1998

[54] HETEROSTRUCTURE LASER

[75] Inventors: James Nelson Baillargeon, Springfield, N.J.; Keh-Yung Cheng, Champaign, Ill.; Alfred Yi Cho, Summit, N.J.

[73] Assignee: Lucent Technologies Inc., Murray Hill, N.J.

[21] Appl. No.: 612,046

[22] Filed: Mar. 7, 1996

[51] Int. Cl.$^6$ ............................. H01S 3/091; H01S 3/30; H01S 3/19
[52] U.S. Cl. .................... 372/75; 372/6; 372/45; 372/46
[58] Field of Search ..................... 372/6, 39, 41, 372/45, 46, 75, 43, 50, 44

[56] References Cited

U.S. PATENT DOCUMENTS

| | | | |
|---|---|---|---|
| 4,982,409 | 1/1991 | Kinoshita et al. | 372/45 |
| 5,084,880 | 1/1992 | Esterowitz et al. | 372/6 |
| 5,202,895 | 4/1993 | Nitta et al. | 372/45 |
| 5,282,218 | 1/1994 | Okajima et al. | 372/46 |
| 5,305,341 | 4/1994 | Nishikawa et al. | 372/45 |
| 5,416,790 | 5/1995 | Yodoshi et al. | 372/46 |

FOREIGN PATENT DOCUMENTS 7-111363  4/1995  Japan .................... 372/43

OTHER PUBLICATIONS

Casey, Jr et al, Heterostructure Lasers Part B: Materials and Operating Characteristics, Academic Press: New York, 1978, p.44. (no month).

Mayer et al, Electronic Materials Science: For Integrated Circuits in SI and GAAS, MacMillian Publishing Co: New York, 1990, inside backover. (no month available).

Primary Examiner—Rodney B. Bovernick
Assistant Examiner—Luong-Quyen T. Phan

[57] ABSTRACT

The specification describes a heterostructure laser utilizing GaAs based materials that emits at 0.98 μm and is thus suitable for pumping an erbium doped fiber waveguide amplifier. The composition of the cladding layers of the laser is designed to give exceptional electrical and optical confinement without the high levels of aluminum that are found to reduce the lifetime of high performing prior art devices.

2 Claims, 4 Drawing Sheets

HETEROSTRUCTURE LASER

FIELD OF THE INVENTION

The invention relates to laser heterostructure diodes useful for pumping erbium doped amplifiers at 0.98 μm, and to erbium amplifier devices pumped with the newly developed laser diodes.

BACKGROUND OF THE INVENTION

The effectiveness of lightwave communication systems increased dramatically with the discovery of the erbium doped amplifier, a true light amplifier. The erbium amplifier structure is remarkably simple, the primary element being a length of erbium doped fiber. However, widespread application of this device awaited the development of an effective optical pump, which proved somewhat more challenging than the erbium-doped amplifier itself. Erbium doped silica glass absorbs most efficiently at 0.98 μm, but at the time of the discovery of the erbium amplifier, no practical laser existed that could effectively pump the 0.98 μm absorption band. A suitable laser was later developed, which was a ternary GaInAs quantum well structure using GaAs waveguide layers and AlGaAs cladding layers. It was found that layers with high aluminum content were effective for light confinement due to the high refractive index variation induced by the aluminum. However, large amounts of aluminum are necessary to obtain this effect, and it has now been realized that the presence of aluminum in these structures produces operational problems. Aluminum is reactive and tends to oxidize in these structures if not carefully protected. Moreover, GaAs with high aluminum content is mechanically rigid, which makes the ternary material susceptible to dark line defect propagation. Both of these effects contribute to a reduction in operating lifetime, particularly when driven to high output powers.

An alternative diode structure without aluminum was developed based on GaInP as the cladding material. This alternative material does not oxidize like the aluminum ternary, and is not as susceptible to dark line defect propagation. However, these enhancements are offset by a reduction in electrical and optical confinement. The refractive index difference between this material and the GaAs waveguide layer is less than with the aluminum-containing material, thus optical confinement is less efficient, and a smaller conduction band offset results in less effective electrical confinement.

Simply reducing the aluminum content of the cladding layer would at first appear to be a third option. However, this expedient by itself substantially reduces electrical confinement. Likewise, making the aluminum layer very thin reduces the total aluminum content of the structure but results in inadequate optical confinement. More information on prior art efforts to produce lasers emitting at 0.98 μm is given by M. Shimuzu, et al, "Erbium-Doped Fiber Amplifiers with an Extremely high Gain Coefficient of 11.0 dB/mW", *Electronic Letters*, Vol. 26, No. 20, September 1990, pp 1641-1643.

STATEMENT OF THE INVENTION

We have developed a laser operating at 0.98 μm that realizes the electrical and optical advantages of the aluminum containing heterostructure, but which largely avoids the drawbacks associated with high aluminum content. It obtains the positive attributes of each of the structures previously described by using a dual cladding layer. The dual cladding layers for the n and p sides are different, and produce asymmetric profiles for both refractive index and bandgap. The p-side dual cladding layer comprises a first AlGaInP layer proximate to the waveguide layer, and a second cladding layer of GaInP. The AlGaInP layer has a lower level of aluminum than the typical cladding structure of the prior art. The n cladding dual layer comprises a first layer of AlInP, and a second layer of GaInP. This asymmetric dual cladding layer structure has a bandgap differential that is larger, on both the n and p sides of the junction, than the bandgap of both of the heterostructures discussed earlier. As a consequence the carrier confinement of this structure is also superior to that of the prior art structures. The refractive index differential is also larger, giving superior optical confinement.

Although potentially useful for a variety of applications the improved heterostructure laser was developed for pumping erbium doped fiber amplifiers, and the combination of the heterostructure laser with a suitable erbium doped fiber waveguide, with signal input and output means, forms an additional embodiment of the invention.

Erbium doped fiber amplifiers can be pumped at either 1.480 μm or 0.98 μm. Pump lasers emitting at 1.480 μm are considered to be reliable but those operating at 0.98 μm require less injection current and less cooling, thereby reducing electrical power requirements. If pump lasers emitting at 0.98 μm can be made with reliable performance and suitable lifetimes they become the logical choice. This invention is aimed at satisfying that goal.

DETAILED DESCRIPTION

Figure 1:
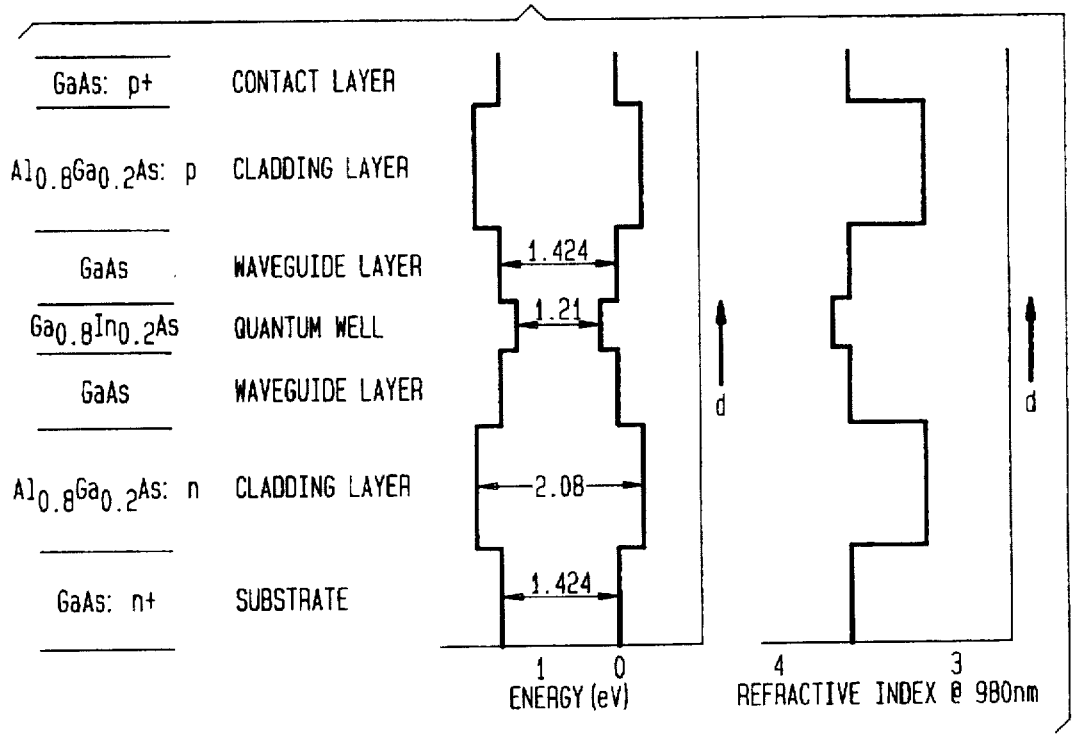
FIG. 1 is a dual plot of refractive index and energy level along a dual abscissa, and the distance d, as measured through the thickness of the multi-level structure, is plotted along the right hand ordinate.

The electrical and optical confinement characteristics of the high aluminum content heterostructure are shown in FIG. 1. The laser structure, with waveguide and cladding layers, is represented as distance d along the right side ordinate of the plot. Distance d is taken through the thickness of the multilayer structure. The active laser region comprises a quantum well structure of $Ga_{0.8}In_{0.2}As$ bounded by GaAs waveguide layers. The composition and characteristics of the active laser region are well known in the art. We have demonstrated our invention using a GaInAs quantum well structure but it is known, for example, that phosphorus can be substituted for arsenic in part to produce a laser emitting at 0.98 μm. In this description we have not attempted to include the many possible permutations, such as multi-quantum wells, superlattices and graded bandgap regions, that are common in this kind of laser diode structure. Most of the laser diodes relevant to this invention are GaAs based materials and it is to be understood that reference to a GaAs based active region is sufficient to convey the intended meaning to one skilled in the art.

Referring again to FIG. 1, the relevant optical and electrical properties for confinement, i.e. the refractive index and the energy band, are plotted along the dual abscissa as shown. The refractive index is measured at 0.98 μm. The bandgap is expressed in electron volts (eV) under zero field condition. The characteristic bandgap of each of the layers is indicated. With this dual plot, the profiles of the relevant properties in the multilevel structure are apparent on inspection. The step height between the active laser region and the confinement layers indicates the effectiveness of the electrical and optical confinement.

As is evident, the confinement characteristics of the heterostructure with AlGaAs cladding layers are good. However as indicated earlier this heterostructure has undesirable aging characteristics.

Figure 2:
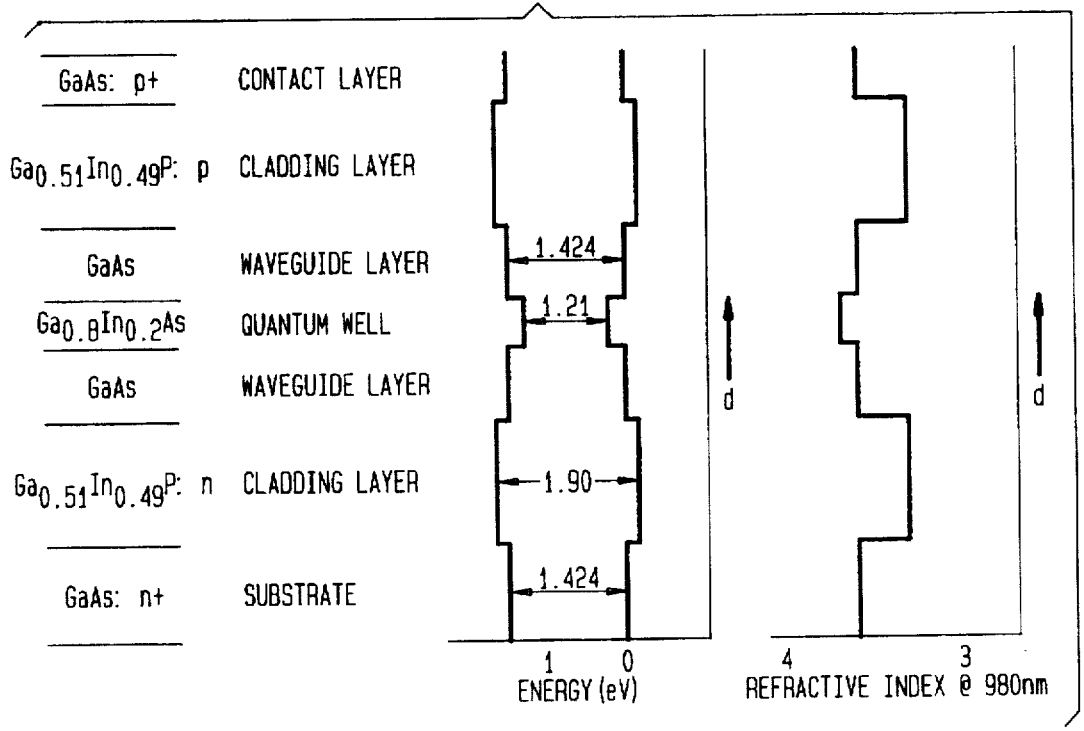
FIG. 2 is a plot similar to that of FIG. 1 for an alternative multi-level structure.

The heterostructure without aluminum, i.e. with GaInP cladding layers, is represented in FIG. 2. The reduction in both electrical and optical containment, when compared with FIG. 1, is apparent. Thus while the effective lifetime should be higher, diodes with this structure have lower efficiencies. State of the art 0.98 μm laser diodes with AlGaAs as confining layer material have a power slope efficiency of the order of 1 W/A, while diodes with GaInP confining regions have a power slope efficiency typically of 0.8 W/A. The lower efficiency requires higher drive currents in the GaInP device to achieve equivalent power. Higher drive currents raise the operating temperature of the device which accelerates aging and cancels the otherwise improved device lifetime.

Figure 3:
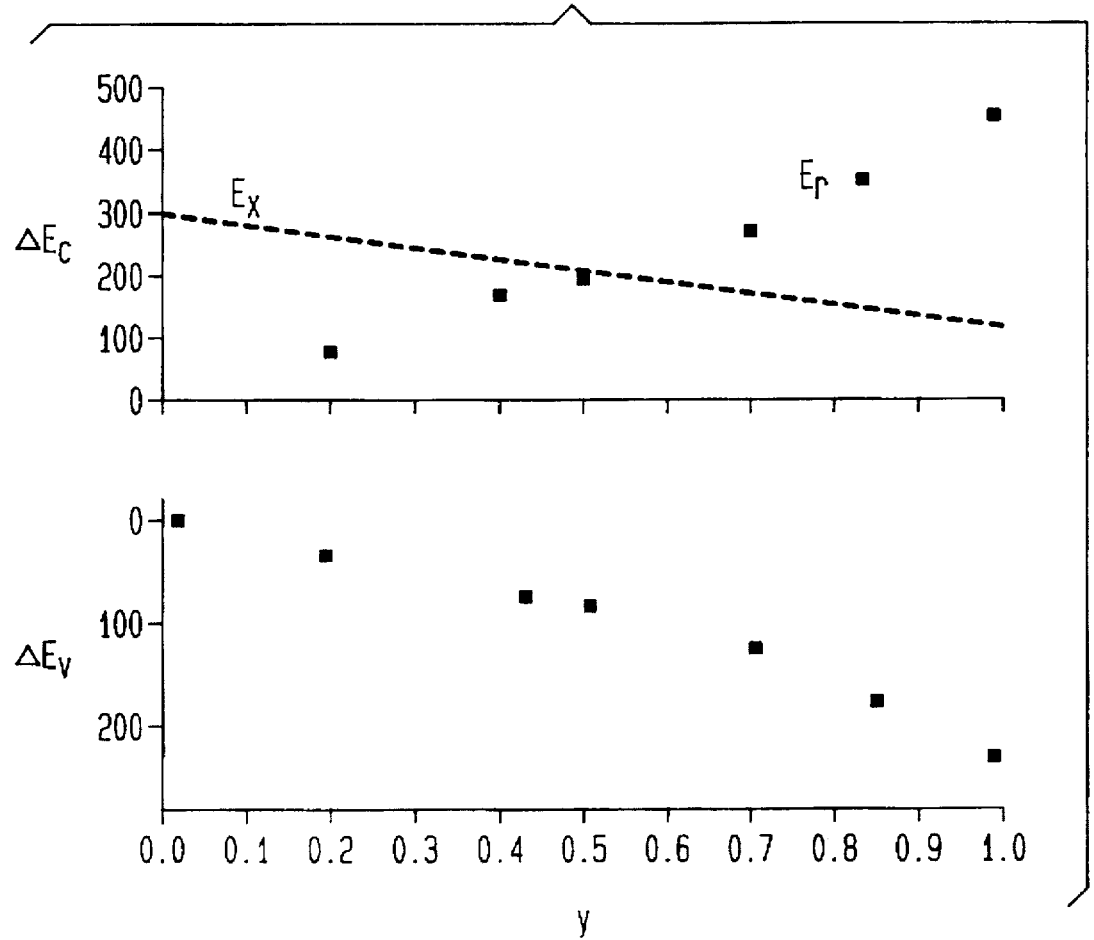
FIG. 3 is a plot of conduction band and valence band offsets vs. composition for GaInP heterostructures with, and without, aluminum.

FIG. 3 plots experimentally determined conduction and valence band discontinuities for the heterojunction system:

$(Al_xGa_{1-x})_{0.51}In_{0.49}P/Ga_{0.51}In_{0.49}P$

The conduction band offsets ($\Delta E_c$) and valence band offsets ($\Delta E_v$), at 5K, are plotted vs. barrier composition (y) for heterojunction system:

$Ga_{0.52}In_{0.48}P/(Al_yGa_{1-y})_{0.52}In_{0.48}P$

Closed circles indicate $E_\Gamma$, dashed line indicates $E_x$. For more technical details see S. P. Najda et al, *J. Appl. Phys.*, 77, p. 3412 (1995).

The relevant aspects in FIG. 3 are that the valence band discontinuity continues to grow monotonically with increasing Al mole fraction, while the conduction band offset reaches a maximum near 50% Al. Therefore, even though the refractive index step between the two materials will continue to grow (which is desirable), no further improvements in electron confinement will be realized if the Al concentration exceeds this value. In fact, electrical confinement decreases when aluminum content exceeds ~50%. Further, an electron blocking layer would be p-type, and low resistivity p-type $(Al_xGa_{1-x})_{0.51}In_{0.49}P$ where Al>75% is difficult to produce. The additional heating ($I^2R$) losses would have a deleterious effect on device lifetime.

Based on an understanding of these principles we have developed a new heterostructure that provides both the superior lifetime performance of the structure of FIG. 2 and the superior confinement characteristics of the structure of FIG. 1. This new heterostructure has confinement layers with different compositions on the n- and p- sides and are slightly asymmetric in their confinement characteristics. The confinement or cladding layers have the following nominal formulas:

| p-side: | $(Al_{0.5}Ga_{0.5})_{0.51}In_{0.49}P$ |
| | $Ga_{0.51}In_{0.49}P$ |
| n-side: | $Al_{0.51}In_{0.49}P$ |
| | $Ga_{0.51}In_{0.49}P$ |

Figure 4:
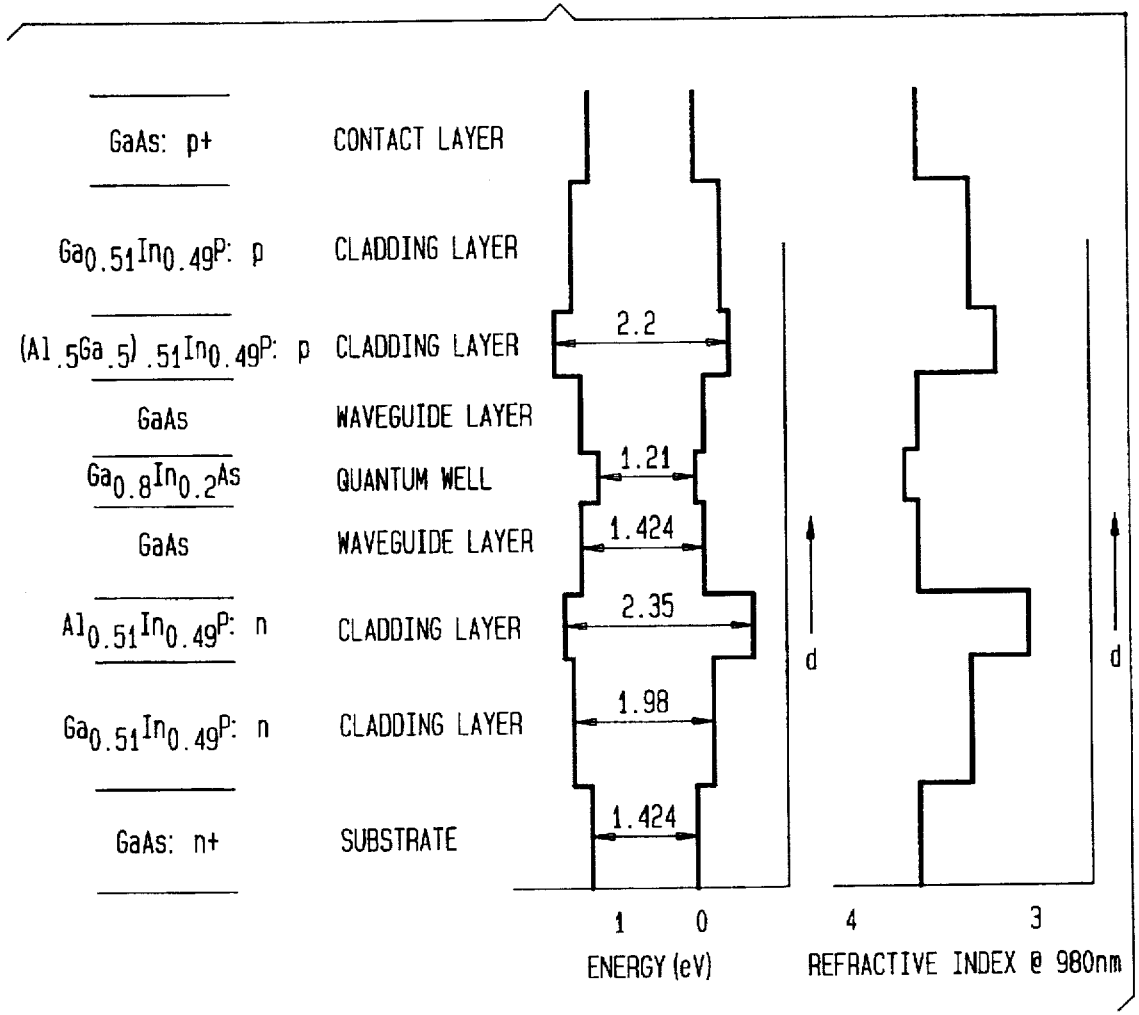
FIG. 4 is a plot similar to that of FIGS. 1 and 2 showing the electron and optical confinement in a heterostructure with a composition according to the invention.

The electrical and optical confinement profiles for this structure are shown in FIG. 4. As will be appreciated, the bandgap differential between the GaAs waveguide layer and the first cladding layer is 0.926 eV on the n-side and 0.776 eV on the p-side, which values compare well with the differential of 0.656 eV in the structure of FIG. 1.

Ranges of values for the thickness of the layers in the structure of FIG. 3 can be prescribed in the context of preferred embodiments. The thickness of the contact layer is non-critical and is typically 0.05 to 1 micron. The ternary (outside) cladding layers, which are aluminum free, are relatively thick, i.e. 0.5 to 2.0 microns. The interior cladding layers, which contain modest amounts of aluminum, are thin, e.g. 1000 Angstroms. The thickness may vary however, typically from 100 to 2000 angstroms. The waveguide layers are typically 1000–1500 Angstroms thick but could vary from 500 to 3000 Angstroms. The quantum well layer is typically very thin, i.e. 50 to 150 Angstroms. The smaller thickness requires more indium, the larger thickness less indium. As indicated earlier there are many alternatives for the active region and these form no part of the invention.

The heterostructure laser just described is ideally suited as a pump for an erbium doped fiber amplifier (EDFA). Such devices are now well known in the art and are described for example by Zyskind et al, "Erbium-Doped Fiber Amplifiers and the Next Generation of Lightwave Systems", *AT&T Technical Journal*, pp. 53–62, January/February 1992. The fiber amplifier operates at a signal wavelength of 1550 nm with high gain, high output power and low noise. The erbium fiber is typically a short length of optical fiber with a core doped at less than 0.1 percent erbium, e.g 500 ppm. The erbium doped fiber is advantageously made by modified chemical vapor deposition techniques that are known in the art. Additional information on the erbium fiber characteristics may be found in P. Urquhart, "Review of Rare Earth Doped Fiber Lasers and Amplifiers", *IEEE Proceedings*, Vol. 135, Part J, No. 6, December 1988, pp 385–405.

Figure 5:
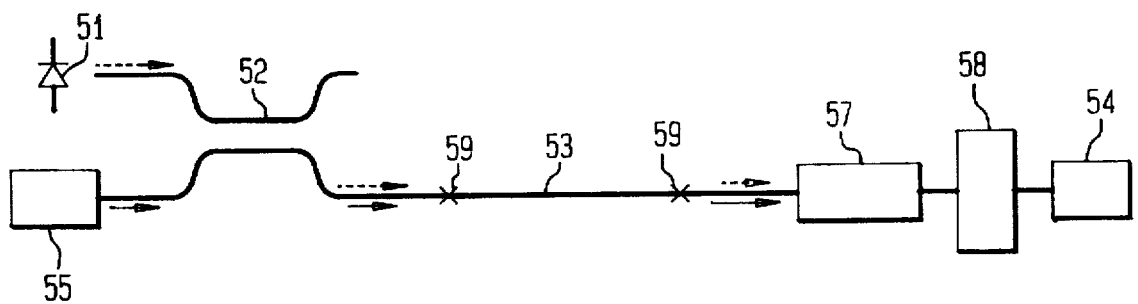
FIG. 5 is a schematic view of an erbium-doped amplifier in which the pumping means comprises the heterostructure laser described in conjunction with FIGS. 1–4.

A typical EDFA device structure is shown in schematic form in FIG. 5. The heterostructure laser pump is shown at 51, coupled to a wavelength division multiplexer 52. The signal to be amplified, represented by input 55, is combined with the pump energy through multiplexer 52. The dashed arrows represents the pump light and the solid arrows represent the signal. The combined pump and signal beams are connected to erbium amplifier 53 through fusion splices 59. As pump light propagates along the erbium doped portion 53 of the fiber it becomes depleted as pump energy is absorbed by erbium ions being raised to an excited state. As the signal propagates through the region occupied by excited erbium ions it stimulates emission of energy from the excited ions and thus becomes amplified. The amplified signal is processed through optical isolator 57 to prevent unwanted feedback, and the remaining pump energy is filtered by optical filter 58. The amplified output is represented by 54.

Figure 6:
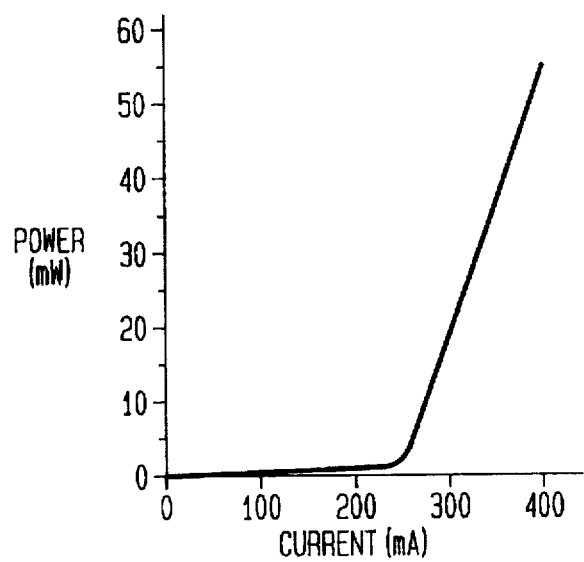
FIG. 6 is a power curve for a diode with the heterostructure shown in FIG. 4.

A power curve for a diode represented by the composition of FIG. 4 is shown in FIG. 6. The power in mW is plotted vs. diode current in mA. The threshold current is 250 mA, the current density is 588 A/cm$^2$, and the power slope is 0.73 W/A. The power slope for this device is considered below the theoretical value and the optimum is believed to be comparable to the best power slopes obtainable with high aluminum devices.

Various additional modifications of the invention will occur to those skilled in the art. For example, the ternary and quaternary compositions described herein are essentially non-stoichiometric, and the mole fractions indicated are preferred values only. Modest departures from these fractions can be made while still retaining the properties necessary to carry out the invention. Such departures will vary depending on the particular composition and other circumstances but as a general rule a variation of +/−0.04 would be reasonably regarded as an attempt to duplicate the results described herein. Generalized formulas for the compositions of the layers of the device represented by FIG. 4 are:

outside cladding layers: $Ga_xIn_{1-x}P$ p type inside cladding layer: $(Al_yGa_{1-y})_zIn_{1-z}P$ n type inside cladding layer: $Al_aIn_{1-a}P$ quantum well: $Ga_bIn_{1-b}As$ where x has a value in the range 0.48–0.54, y has a value in the range 0.40–0.60, z has a value in the range 0.48–0.54, a has a value in the range 0.48–0.60, and b has a value in the range 0.15 to 1.0.

It should be evident that the outside cladding layers may have different compositions within the general formula and therefore "x" can be designated as x or x' in the respective layers.

Such departures as just described, and other departures and equivalent embodiments which basically rely on the teachings through which this invention has advanced the art are properly considered within the scope of the invention as described herein and claimed below.

We claim:

1. A heterostructure laser diode emitting at 0.98 microns comprising a layered structure characterized by the following layers in sequence:

(a) substrate comprising GaAs
   (b) first cladding layer comprising $Ga_xIn_{1-x}P$ where x has a value in the range 0.48–0.54,
   (c) second cladding layer comprising $Al_aIn_{1-a}P$ where a has a value in the range 0.48–0.60,
   (d) first waveguide layer,
   (e) active layer emitting at 0.98 microns,
   (f) second waveguide layer,
   (g) third cladding layer comprising $(Al_yGa_{1-y})_zIn_{1-z}P$, where y has a value in the range 0.48–0.54, and z has a value in the range 0.49–0.53,
   (h) fourth cladding layer comprising $Ga_{x'}In_{1-x'}P$ where x' has a value in the range 0.48–0.54,
   (i) contact layer, said layered structure further characterized in that:

(1) the bandgap of layer (b) is essentially the same as the bandgap of layer (h),
   (2) the bandgaps of layers (b) and (h) are less than the bandgap of layer (c), and
   (3) the band gap of layer (c) is greater than the bandgap of layer (g).

2. The laser diode of claim 1 in which the active layer has the approximate composition: $Ga_{0.8}In_{0.2}As$.

* * * * *